United States Patent
Kim et al.

(10) Patent No.: US 6,866,974 B2
(45) Date of Patent: Mar. 15, 2005

(54) SEMICONDUCTOR PROCESS USING DELAY-COMPENSATED EXPOSURE

(75) Inventors: Keeho Kim, McKinney, TX (US); Jarvis B. Jacobs, Murphy, TX (US); Reima T. Laaksonen, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 320 days.

(21) Appl. No.: 10/274,081

(22) Filed: Oct. 21, 2002

(65) Prior Publication Data

US 2004/0076896 A1 Apr. 22, 2004

(51) Int. Cl.⁷ .................................................. G03F 9/00
(52) U.S. Cl. ........................................... 430/30; 355/53
(58) Field of Search ..................... 430/30, 311; 355/53, 355/77

(56) References Cited

U.S. PATENT DOCUMENTS 6,447,964 B2 * 9/2002 Okino et al. .................. 430/30

* cited by examiner

*Primary Examiner*—Christopher G. Young
(74) *Attorney, Agent, or Firm*—W. James Brady, III; Frederick J. Telecky, Jr.

(57) ABSTRACT

A method of providing critical dimension (CD) gate control during photolithography is achieved by scanning a trial wafer from a batch by an exposure tool and then measuring the gate width to determine shot zones for bi-shot (BSE) exposure. The time delay based on shot or exposure order is determined for each BSE zone. The shot or exposure dose for the other wafers from the same or similar batch is then determined on the bi-shot exposure and the shot order.

7 Claims, 2 Drawing Sheets

SEMICONDUCTOR PROCESS USING DELAY-COMPENSATED EXPOSURE

FIELD OF INVENTION

This invention relates to semiconductor manufacturing and more particularly to improved photolithography process using delay compensated exposure.

BACKGROUND OF INVENTION

The present invention relates to the photolithography process on a semiconductor wafer in the process of manufacturing semiconductor devices and more particularly to the process of fabricating the gate electrodes of CMOS type devices on a semiconductor wafer. The critical dimension (CD) of the gate width determines the speed of the device. The width of the gate determines the speed. The width is in the direction between the source and the drain as illustrated by width "w" in FIG. 1. The shorter or narrower the width "w" of the gate the faster the device is. If the gate width is too short there is too much heat and if the width is too wide the device is too slow. It is desirable that the width of all of the gates for all of the devices on a given wafer be uniform to have the same characteristics. It is therefore desirable that the critical dimension (CD) of the gate be the same across the whole wafer. However, this critical dimension (CD) without compensation changes randomly or systematically as a function of locations on the wafer. This change is known to be caused by etching, CMP polishing, and film deposition variations.

The current process of manufacturing gate electrodes on semiconductor devices includes providing a wafer with a layer of polysilicon on the wafer, generating a photomask for the areas to provide gates, coating the wafer with photoresist, transmitting light using a scanner with a lens (reducing image 4 times for example) across the wafer to expose the photoresist with light except in the areas of the mask, developing the exposed areas of the photoresist by a wet etch to leave on the gate areas unexposed by the photoresist, dry etching the exposed areas to dry etch all the polysilicon away except the gate area under the remaining unexposed photoresist and then removing the photoresist to leave the polysilicon gates. The scanner is a camera such as a Nikon S305 that scans one die on the wafer at a time. The camera remains fixed and a table holding the wafer is moved to scan the light onto the wafer die by die. For an example, a desired gate width "w" is 0.12 micrometer. This may be achieved using a photoresist known as PAR 707 of Sumitomo and a light dosage of 20 millijoules per square cm.

As discussed above this critical dimension (CD) width changes across the wafer under prior art processing. The current process attempts to solve this problem by exposing a test wafer from a batch to a given dosage (20 millijoules per square cm for example). Measurements are then taken across the wafer by a Scattered Electron Machine (SEM). There are some zones where the gates may be over exposed and too narrow such as say 0.10 $\mu$m, some zones that are under exposed and 0.14 $\mu$m and some that are just right. The conventional method of solving this across the wafer critical dimension (CD) variation is what is termed bi-shot exposure (BSE). The bi-shot exposure (BSE) is a process wherein, after the measurement in the SEM, the exposure tool defines and provides different dose for each location to compensate for CD variation caused by the error sources discussed above such as topography or subsequent etch process as discussed above. It has been determined that this BSE exposure process does not correct the problem and sometimes the BSE process makes for more error.

SUMMARY OF INVENTION

In accordance with one embodiment of the present invention a shot order correction dosage is provided to correct for different diffusion amount.

In accordance with another embodiment of the present invention the exposure tool dose is equal to an amount to compensate for shot order changing effect and the effect of other error sources causing variations in the critical gate width dimension.

In accordance with an embodiment of the present invention the method of providing critical dimension gate control during photolithography includes scanning a trial wafer containing containg a plurality of dies from a batch by an exposure tool; measuring the gate widths of the dies across the wafer and determining shot zones of common shot dosage for exposure to approximately equalize the gate widths across the wafer; determining time delay based on shot order for each shot zone; and determining the shot dose for each die based on the shot dose for the shot zones and shot order across the wafer.

DESCRIPTION OF DRAWING

FIG. 2 illustrates the delay effect wherein

DESCRIPTION OF PREFERRED EMBODIMENT OF THE INVENTION

Figure 1:
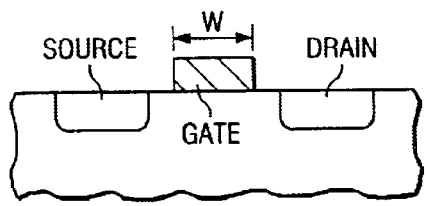
FIG. 1 illustrates the gate width dimension.

One of the critical dimensions is the gate width "w" in the direction between the source and drain electrodes of a CMOS transistor on a semiconductor chip as illustrated in FIG. 1. It is desirable that all the gate widths "w" across a wafer be uniform or function in a uniform manner so the speed and performance of all of the separate dies from the same wafer is the same.

Because of the varying etching, deposition, and CMP polishing the widths of these gates may not be the same. This has the undesirable result that the dies from the same wafer have different performance characteristics.

As discussed previously in the background the conventional method to achieve across the wafer uniform critical dimension (CD) characteristics is by bi-shot exposure (BSE) which means that an exposure tool is provided that defines different exposure dose for each location to compensate for the CD variation caused by the error sources of etching, topography, CMP polishing, and film deposition variations. However, the gate width does not come out the correct size even though the BSE process is used and measurements taken from a sample wafer and the exposure adjusted for each zone based on the measured error. This is because the error correction in the conventional prior art method does not take into account shot order effect.

Experiments have shown that the CD of the gate changes linearly with shot order. Namely, the CD gate width "w" of the gates in the die exposed first is smaller than the CD gate width "w" in the die exposed last. This is due to the chemical acid diffusion in the photoresist so the longer it is delayed in shot order the smaller the critical dimension (CD) of the gate width becomes.

Figure 2A:
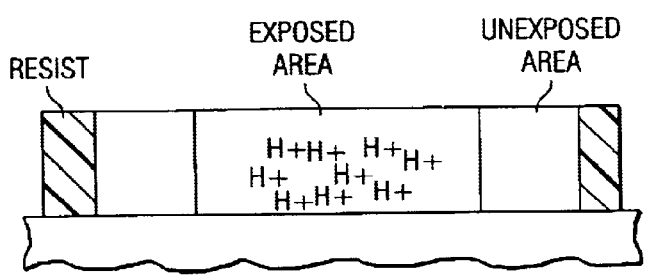
FIG. 2A illustrates the exposed and un exposed area after shot exposure and FIG. 2B illustrates the exposed and un exposed area after a delay.
Figure 2B:
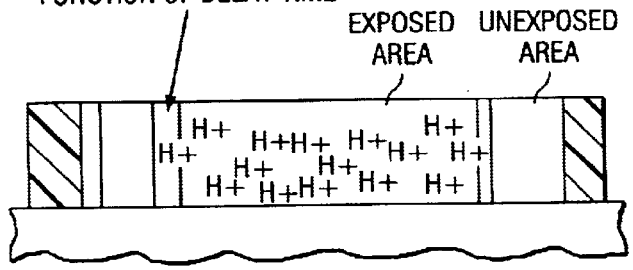

FIG. 2 illustrates the delay effect of 193/248 resist. FIG. 2A illustrates the exposed area with the acid H+ after exposure. FIG. 2B illustrates the effect after a delay. The critical dimension (CD) shrinks by the H+ acid diffusion as represented by the H+ in the unexposed areas. The amount of change is a function of time between the first shot or exposed die and the last shot or exposed die.

Figure 3:
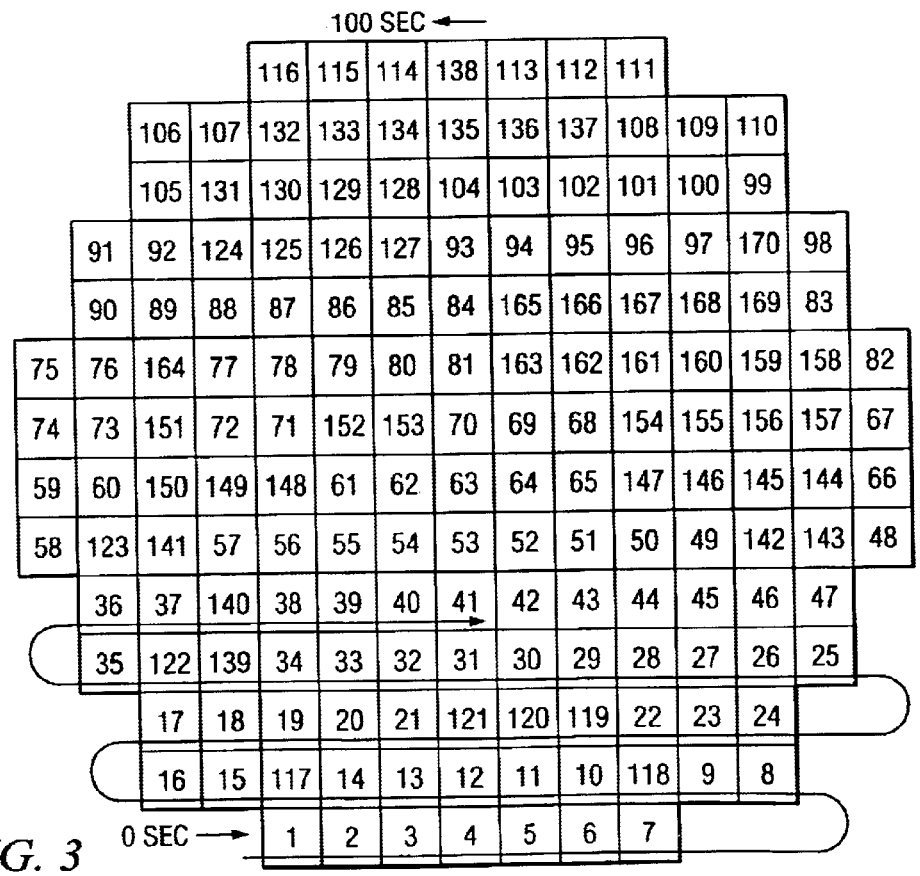
FIG. 3 illustrates the typical scan order of a wafer.

FIG. 3 illustrates the typical shot or scan order which starts from the bottom of the wafer and scans upward across the width of the wafer. The delay time from the first shot at die one to the last shot at die 116 is about 100 seconds. This is a considerable time delay and greatly affects the critical dimension (CD) gate width.

Figure 4:
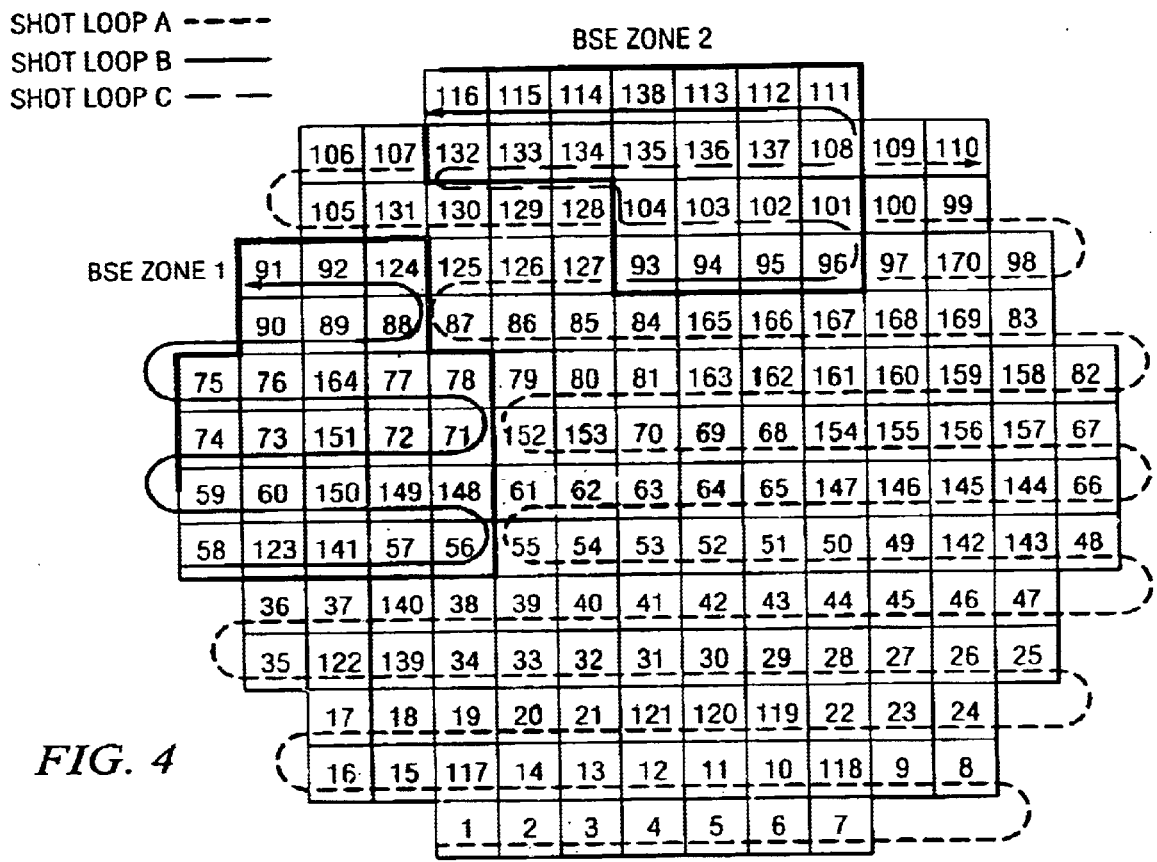
FIG. 4 illustrates the changed scan order by the BSE map.

The shot order changing by BSE causes new critical dimension (CD) variation and some over correction. FIG. 4 illustrates the changed shot order by the BSE map. As discussed above the BSE process measures and determines zones that need different amounts of exposure. For the example discussed above in the background there are three different zones and three different exposures for each of the three zones to compensate for the zone errors. The exposure for zone 3 may be where there is no error found on the SEM test using 20 millijoules. The exposure for zone 2 may be for an over exposed zone on the test and the exposure for zone 1 may be for an unexposed zone on the test.

As illustrated by the case of three different zones in the BSE there is a shot loop A for a third zone 3, a shot loop B for BSE zone 1 and a shot loop C for BSE zone 2. The shot loop order can be A-B-C, C-B-A or B-C-A. Each combination creates different delay time for the die location.

The prior art exposure tool does not take into the account the shot order effect that due to the diffusion of the earlier exposed regions making the earlier gates narrower than the later gates.

In accordance with the present invention this is corrected herein by a delay compensated shot exposure (DSE) which means compensation of shot order changing effect of BSE process by re-adjusting shot order. In this new method, the exposure tool will change and adjust dose and shot order for each location on the wafer as optimum value. The DSE exposure dose at a specific die in principle consists of two components: the standard BSE dose ± the shot order correction (SOC). The SOC is calculated by utilizing two experimental facts. First, the critical dimension (CD) change is proportional to expose dose change. Second, the critical dimension (CD) depends linearly on the shot order. Incorporating this in the shot beam control of the camera the system will calculate the SOC for each die on the wafer or for each zone of dies on the wafer.

Figure 5:
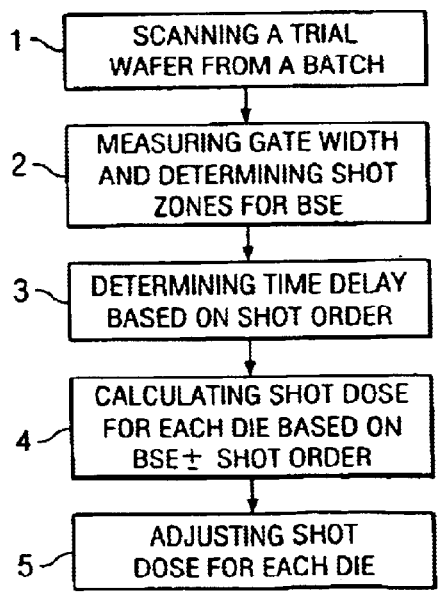
FIG. 5 illustrates the step for determining the shot dose for each die.

In accordance with the present invention illustrated in FIG. 5 the photolithography process comprises the steps of (Step 1) exposing a trial wafer of a wafer batch to a determined light value; (Step 2) measuring the gate widths "w" and determining BSE zones where the dies require the same amount of exposure; (Step 3) determining the time delay for each shot time based on its shot order (SO), (Step 4) calculating the light exposure or shot dose for each die based on BSE zones and shot order (SO) and (Step 5) adjusting the shot dose for each die.

Although the method and system of the present invention has been described in connection with an embodiment, it is not intended to be limited to the specific form set forth herein, but on the contrary, it is intended to cover such alternatives, modifications, and equivalents, as can be reasonably included within the spirit and scope of the invention as defined in the appended claims.

What is claimed is:

1. A method of providing critical dimension gate control during photolithography process comprising the steps of:
    providing an exposure tool that can define a different dose for each location on a semiconductor wafer and
    adjusting said exposure tool dose to compensate for shot order changing effect.

2. The method of claim 1 wherein the adjusting step for adjusting said exposure tool includes adjusting for different dose for each location to compensate for each location to compensate CD variation caused by other error sources than the shot order.

3. A method of providing critical dimension gate control during photolithography process comprising the steps of:
    providing an exposure tool that can define a different dose for each location on a semiconductor wafer; and
    adjusting said exposure tool dose to equal an amount to compensate for shot order changing effect and the effect of other error sources causing variations in the critical gate width dimension.

4. The method of claim 3 wherein said other error sources are measured.

5. A method of providing critical dimension gate control during photolithography comprising the steps of:
    scanning a trial wafer containing contaning a plurality of dies from a batch by an exposure tool;
    measuring the gate widths of the dies across the wafer and determining shot zones of common shot dosage for exposure to approximately equalize the gate widths across the wafer;
    determining time delay based on shot order for each shot zone; and
    determining the shot dose for each die based on the shot dose for the shot zones and shot order across the wafer; and
    adjusting the shot dose for each die based on the determined shot dose.

6. The method of claim 5 wherein said shot zones are bi-shot (BSE) zones.

7. An apparatus for providing critical dimension gate control during photolithography process comprising:
    an exposure tool that can define a different dose for each location on a semiconductor wafer and
    means for adjusting said exposure tool dose to compensate for shot order changing effect.

\* \* \* \* \*